United States Patent [19]

Kosina et al.

[11] Patent Number: 4,775,839

[45] Date of Patent: Oct. 4, 1988

[54] CONTROL APPARATUS FOR THE ELECTRONIC DETECTION IN A.C. POWER TRANSMISSION LINES OF FAULT LOCATIONS CAUSING POWER LOSSES

[75] Inventors: Bohumil Kosina, Gossau; Peter Hubacher, Engelburg; Radovan Talacko, St. Gall, all of Switzerland

[73] Assignee: Korona Messtechnik Gossau, Gossau, Switzerland

[21] Appl. No.: 10,980

[22] PCT Filed: May 20, 1986

[86] PCT No.: PCT/CH86/00066

§ 371 Date: Jan. 16, 1987

§ 102(e) Date: Jan. 16, 1987

[87] PCT Pub. No.: WO86/07160

PCT Pub. Date: Dec. 4, 1986

[30] Foreign Application Priority Data

May 21, 1985 [CH] Switzerland .................. 2156/85

[51] Int. Cl.$^4$ .................................. G01R 31/08
[52] U.S. Cl. .................. 324/536; 324/530; 324/520; 340/743
[58] Field of Search ............ 315/378; 342/176; 340/743; 324/72, 72.5, 536, 530, 520

[56] References Cited

U.S. PATENT DOCUMENTS 3,173,086 3/1965 Kresge .................. 324/520
4,006,410 2/1977 Roberts .
4,356,443 10/1982 Emery .................. 324/520

Primary Examiner—Reinhard J. Eisenzopf
Assistant Examiner—Jose M. Solis
Attorney, Agent, or Firm—Watson, Cole, Grindle & Watson

[57] ABSTRACT

The control apparatus has an antenna (10) for the reception of electromagnetic radiation emitted from the alternating current transmission line. The antenna (10) is connected to an amplifying device (20) the signal output (22) of which is connected to an oscilloscope (30) in such a manner that the output signals of the amplifying device (20) effect both vertical and horizontal deflection of the image spot on the image screen of the oscilloscope (30). The amplifying device (20) is constructed for the amplification of a broad frequency range extending from below the line frequency to at least 20 kHz, wherein the amplification in the frequency range below about 10 kHz is reduced. The whole frequency spectrum of the output signals of the amplifier device (20) is fed to the oscilloscope (30). In the course of monitoring a transmission line the low frequency signal from the alternating line voltage appears on the image screen of the oscilloscope (30) as a smooth closed curve, while in contrast the high frequency signals originating from corona discharges at the fault locations of the transmission line appear as disturbances of the smooth closed curve. The shape of the disturbances, their position on the closed curve and their amplitudes enable the type and condition of fault locations to be determined.

11 Claims, 3 Drawing Sheets

CONTROL APPARATUS FOR THE ELECTRONIC DETECTION IN A.C. POWER TRANSMISSION LINES OF FAULT LOCATIONS CAUSING POWER LOSSES

The invention concerns a control apparatus for the electronic detection of fault locations in overhead alternating current transmission lines in which power losses occur through corona discharges.

In electric transmission lines, particularly high voltage overhead transmission lines, relatively small damage to the conductors, insulators and earthing (grounding) means lead to appreciable current losses. However, it is of particular significance that such damage tends to increase or propagate and may become the cause of short-circuits which leads to a switching-off of the network portion in question and in certain circumstances may even have the consequence of still greater damage to the network causing correspondingly greater expenditure in repair. Hence for reliable operation it is necessary to keep the condition of overhead transmission lines under control and to detect any fault locations arising at an early stage as far as possible so that the fault may be rectified in good time and still at a relatively low cost before greater damage to the network develops from them.

In general the monitoring of overhead transmission lines is undertaken by experts who periodically drive or walk along the overhead transmission lines and check temporarily switched off conductor sections visually for fault locations in which mostly the need to climb up on high voltage masts or poles cannot be avoided. Such a monitoring of overhead transmission lines is not only expensive in time and costs but also make greater demands on the controlling personnel who must have a sufficiently good physical constitution as well as an adequate technical experience. Furthermore, the possibility cannot be excluded that despite such a careful and knowledgeable monitoring, fault locations which hardly show themselves may be overlooked and may lead to greater network damage.

For many years now attempts have been made to obviate this demanding and uneconomic visual monitoring process and to replace it with another process which permits detection of fault locations in alternating current overhead transmission lines from a distance and while a transmission line remains switched on, in a more rapid and reliable manner and which in addition affords a reliable network monitoring with fewer controllers and above all with controllers who are not placed under such high requirements.

The recognition that conductor, insulation and coupling defects cause local heating-up of the relevant plant parts has given rise to the idea of thermographically recording the critical positions of overhead transmission lines. But this control procedure is also relatively expensive.

Furthermore, it has been recognized that the relevant fault positions of overhead transmission lines give rise to current losses through discharges, particularly corona discharges which are sources of electromagnetic radiation the frequencies of which are considerably higher than the line frequency and are not in any harmonic relationship to the line frequency. This ascertainment has led to an electronic monitoring process in which the electromagnetic field along the overhead transmission line is monitored for irregularities by means of an antenna, an amplifier device and an oscilloscope. Apparatus of this type has been disclosed in U.S. Pat. No. 4,006,410. In this known apparatus the high frequency signals received by the antenna are subjected to Fourier analysis by modulation with an internal signal of variable frequency and with the aid of band filters and line traps. For this, however, a relatively high technical expenditure is necessary, which causes significant costs and gives rise to an increased susceptibility to faults in the apparatus.

The present invention has accordingly the aim to provide a technically simpler and less fault-prone control apparatus for the electronic detection of fault locations in overhead transmission lines.

The aim of the invention is achieved by the provision of electronic control apparatus defined in the claims. In the control apparatus according to the invention which includes an antenna, an amplifying device and an oscilloscope, the amplifying device is constructed for broadband amplification of the signal received by the antenna in a frequency band from a lower limiting frequency which lies below the low frequency line alternating current frequency to an upper limiting frequency of at least 20 kHz, preferably lying between 200 MHz and approximately 1 Ghz, wherein a range between the lower limiting frequency and approximately 10 kHz the gain of the amplifying device is reduced. The entire frequency spectrum of the output signal of the amplifying device is fed to an input circuit of the oscilloscope for the vertical and horizontal deflections of the image spot so that on the image screen of the oscilloscope the low frequency signal produced on the transmission line by the sinusoidal alternating line voltage appears as a smooth closed curve and the high frequency signals caused by corona discharges are represented as disturbances on the closed curve. The appearance, magnitude and position of the disturbances on the closed curve are characteristic of the location and type of faults or fault positions of the overhead transmission line.

The advantages achieved by the invention consist particularly in that the control apparatus is technically relatively simple, inexpensive and not very susceptible to faults. Since the control apparatus consists essentially of a broad-band amplifying device rather than a frequency analyser, the invention enables the construction of a relatively light-weight instrument which is simple to manipulate or operate and which is always ready for operation, moreover even when it is provided with its own operational current supply such as batteries or accumulators, whereby it can be carried by the operating person and so enables monitoring from the ground by walking or driving past, and especially enables monitoring from the air by flying past the overhead transmission line in a helicopter, so that the transmission line monitoring may always be organised for maximum economy and taking into account the given circumstances such as the length of the section, condition of the terrain, the frequency of the controls to be undertaken and the weather forecasts. The localisation or pin-pointing of fault positions and the determination of the type of fault, such as mechanical damage, corrosion, contamination, air bubbles, overheating etcetera ensues by visual observation of the image visible on the screen of the oscilloscope, which in the case of an ideal intact transmission line is a smooth closed curve, while in contrast the presence of a fault location in the transmission line manifests itself as e.g. a jagged or tooth-like disturbance of this smooth curve in a characteristic form of appearance of the relevant type of fault. The types of fault that can arise and the associated characteristic disturbance curves can be assembled together in a catalogue or manual so that the determination of the type of fault is reduced to a comparison and the controller no longer needs to have an extensive experience but instead can be entrusted only with the servicing of the control device, i.e. essentially with the servicing of an oscilloscope. The amplitudes of the disturbances that may be seen on the image screen of the oscilloscope in the event of faults depend on the magnitude of the electric discharges taking place at the fault locations and by measuring the amplitude of the faults, at least coarsely, information is obtained regarding the condition of a detected fault. This determination of faults according to location, type and condition can be undertaken immediately, for example during a monitoring flight. The control apparatus according to the invention also permits without difficulties the storage of the images appearing due to faults on the image screen of the oscilloscope, e.g. by means of a counter coordinated with the relevant location in the line; the storage may for instance take place by recording on photographic film, and the stored or recorded images can then subsequently be evaluated at a ground station. In addition to the advantage that such storage or recording brings for the necessary documentation for the repair of the fault locations discovered, additional advantages arise in that even for the shortest monitoring periods a controlling personnel wholly inexperienced in fault detection may be used and moreover the possibility of mistakes in the detection and judgment of faults is further excluded, in contrast to the hitherto subjective and optical controls, because such subjective errors are very extensively restricted through the use of an electronic apparatus. Finally, by means of a control apparatus according to the invention the monitoring of transmission lines is safer and above all less physically demanding for the controller himself, since no poles or masts have to be climbed and the control takes place at a sufficient safety distance of a switched-on transmission line, from the ground or in the air at a flight height of e.g. 30 m above the transmission line. Advantageous preferred embodiments of the invention are given in the dependent claims.

The invention will now be described, purely by way of example, by reference to the accompanying drawings in which.

Figure 1:
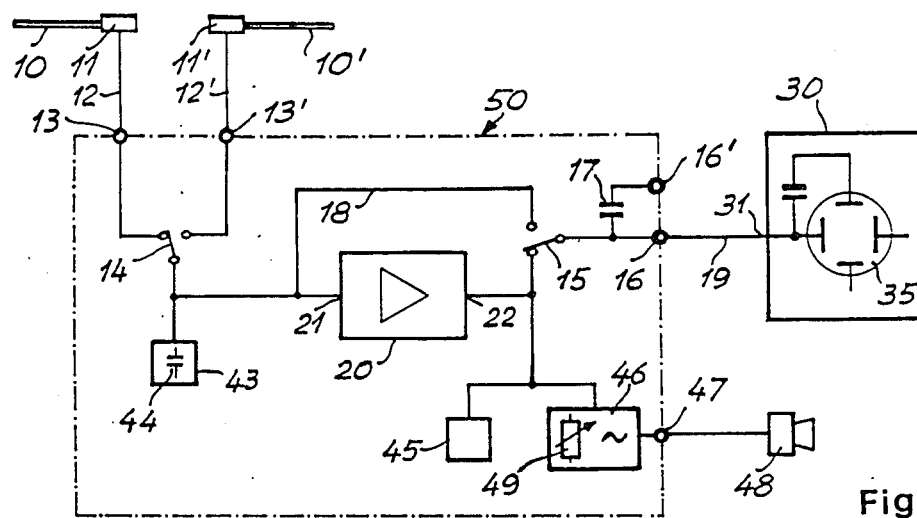
FIG. 1 is a schematic block circuit diagram of a preferred embodiment of the control apparatus according to the invention.

According to the block diagram that may be seen in FIG. 1 the control apparatus for the detection of fault locations on overhead transmission lines has as its main components an antenna 10, an amplifying device 20 and an oscilloscope 30. The antenna 10 is provided with a retaining device 11 with the aid of which the antenna may be secured at e.g. the left outer side of the cockpit of a helicopter. Advantageously, a second antenna 10' may also be provided which can be mounted with the aid of an associated retaining device 11' at the opposite outer side of the cockpit of an aircraft. The antennas 10 and 10' are releaseably connected via shielded antenna cables 12 and 12' to terminals 13 and 13'. A manually actuatable change-over switch 14 permits one or other antenna 10 or 10' to be selectably connected to a signal input 21 of the amplifying apparatus 20. The latter has a signal output 22 which is connectible by means of a manually actuatable switch 15 to an output terminal 16. The output terminal 16 is connected by way of a capacitor 17 of low capacitance, e.g. 220 pF to a second output terminal 16'. By changing the switch 15 over the output terminal 16 may be separated from the signal output 22 of the amplifying apparatus 20 and connected directly by way of a by-pass conductor 18 to the antenna changeover switch 14. The oscilloscope 30 has a signal input 31 which is selectably connected by way of a shielded cable 19 with one or other of the output terminals 16 and 16'.

Figure 2:
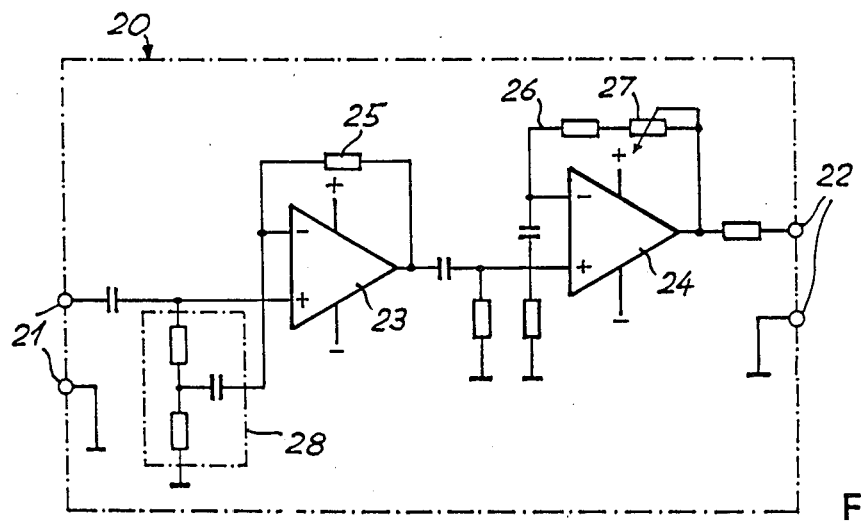
FIG. 2 is a circuit diagram of the preferred amplifier device used in the control apparatus.
Figure 3:
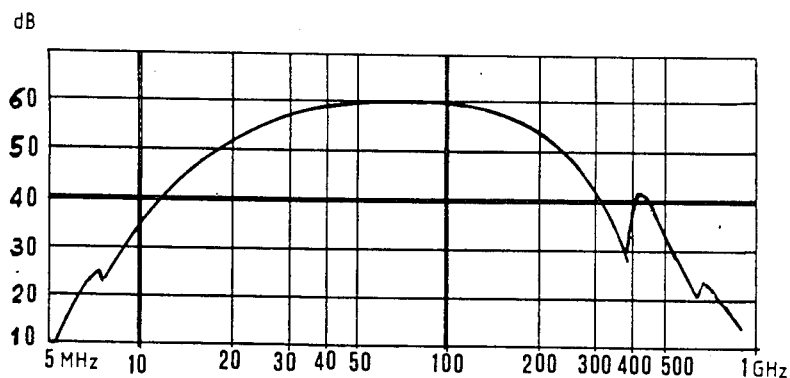
FIG. 3 is an amplification curve of the amplifying device according to FIG. 2.

An example of the circuit arrangement of the amplifying device 20 is shown in FIG. 2. It may be seen that two integrated operational amplifiers 23 and 24 are connected in tandem and each of these operational amplifiers has a feed-back stage 25, 26 respectively from the output to the inverting input. In the feedback stage 26 of the second operational amplifier 24 a variable resistor 27 is provided to adjust the gain. The amplifying device 20 is capable of amplifying signals in a broad frequency band from a lower limiting frequency below the alternating current line frequency to an upper limiting frequency lying between 200 MHz and about 1 GHz. In the frequency range of 5 MHz to the upper limiting frequency the gain is at least 10 dB and in the ultra-short wave range, i.e. in the frequency range of 30 MHz to 200 MHz the gain is from 40 to 60 dB when the maximal amplification is set by means of the variable resistor 27. A resistor-capacitor-combination 28 connected with the first operational amplifier 23 has the task of reducing the amplification of signal frequencies to below approximately 10 kHz. The characteristic curve of the amplification as a function of the signal frequency is illustrated by way of example in FIG. 3.

The whole frequency spectrum of the output signal of the amplifying device 20 is passed by way of cable 19 to the oscilloscope 30 which may be of a commercially available battery-operated type, and moreover in such a manner that both the horizontal or X-deflection as well as a vertical or Y-deflection of the image spot on the screen 35 is rendered possible. Consequently a sinusoidal signal $S_N$ at line frequency is represented on the screen as a closed smooth curve 40, FIG. 5. When the X- and Y-deflections are correctly adjusted the curve 40 is a circle. The high frequency signals $S_H$ originating from fault locations on the overhead transmission line that is being checked appear on the image screen of the oscilloscope 30 as disturbances 41 of the closed smooth curve 40. In general, the high-frequency radiations emitted from the fault locations of an overhead transmission line have significantly smaller amplitudes as the radiation emitted from the low frequency alternating voltage of the transmission line. Since, however, as already mentioned, in the amplifying device 20 low frequency signals below 10 kHz are amplified to a lower extent than the high frequency signals, the amplitudes of disturbances 41 appear on the image screen of the oscilloscope 30 in a magnified way in relation to the diameter of the closed curve 40 and are thus clearly visually detectable. As a result of the reduced gain for signals below 10 kHz advantageously also the possibly present harmonic waves of the line frequency are suppressed on the image screen of the oscilloscope 30.

When an overhead transmission line is monitored from the air, particularly by means of a helicopter, the flight path is along the transmission line at a lateral spacing of from 20 to 30 m, wherein the antenna 10 or 10' is connected to that side of the aircraft cockpit which faces the transmission line. The capability of changing over between the antennas 10 and 10' by means of the switch 14 is advantageous because this enables flying to take place always on that side of the overhead transmission line which is safer for flight and never into the sun.

Figure 4:
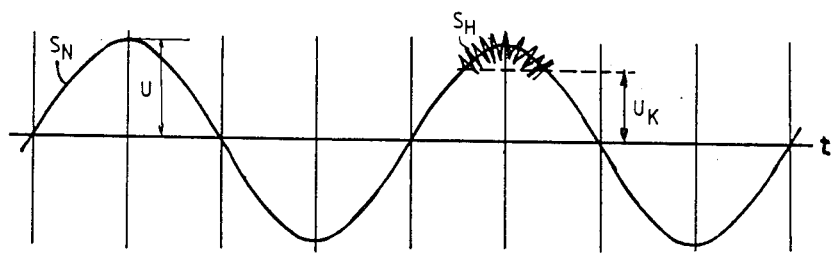
FIG. 4 is a graph of the signal originating from the line alternating voltage against time and a superposed high frequency signal caused by a fault location.

In order to explain the method of determining fault locations FIG. 4 shows schematically in the form of a line diagram on a time scale t a low frequency signal $S_N$ with a line frequency of 50 or 60 Hz and a high frequency signal $S_H$ as received by the antenna 10 when the described control apparatus detects in the transmission line a fault location with losses caused by a corona discharge. In the case of an ideal, intact overhead transmission line the received low frequency signal $S_N$ has a smooth sinusoidal shape the peak value U of which is proportional to the amplitude of the alternating voltage on the transmission line. When, however, corona discharges arise at the position under examination, the smooth run of the sinusoidal line for the low frequency signal $S_N$ is disturbed by superposed oscillations of a high frequency signal $S_H$. Since the corona discharges arise above a certain initial voltage, only the peak region of the sinusoidal line is subjected to the disturbance, wherein the height of the starting point $U_K$ of the high frequency signal $S_H$ corresponds to the initial voltage of the corona discharges. The amplitudes of oscillation of the high frequency signals $S_H$ enable inferences to be made about the magnitude of the corona discharges arising at the fault location and thus about the condition or state of the fault location. The high frequency signal $S_H$ illustrated in FIG. 4 is caused by positive corona discharges, while in the case of negative corona discharges the disturbance would rise at the negative half-wave of the low frequency signal $S_N$.

Figure 5:
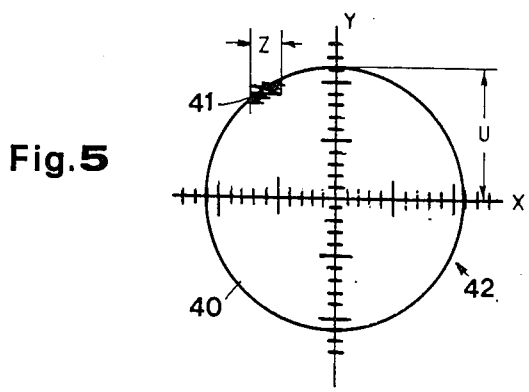
FIG. 5 is an oscillogram that may be seen on the image screen of a control apparatus when there is a fault on the overhead transmission line, having a closed smooth curve corresponding to the line alternating voltage and a superposed disturbance corresponding to the electric discharges occurring at the fault location.

FIG. 5 is a schematic representation of an oscillogram 42 produced by the control apparatus according to the invention on an oscilloscope screen having both an X-scale and a Y-scale, wherein a disturbance 41 caused by a high frequency signal is superimposed on the closed curve 40 for the low frequency signal. From the ratio of the amplitude U of the closed curve 40 (radius of the circle) to the amplitude Z of the disturbance 41 the magnitude of the losses arising at the fault location may be determined. Expediently, Tables are assembled for the determination of losses which permit a rapid evaluation of an oscillogram obtained during a test.

It has been shown that for each type of fault a typical disturbance 41 is obtained and so for an oscillogram given by a fault location it is unambiguously possible to determine the actual fault position from the appearance of the disturbance 41, its position on the closed curve 40 and its magnitude. Examples for this are illustrated in FIGS. 6 to 9.

Figures 6, 7, 8, 9:
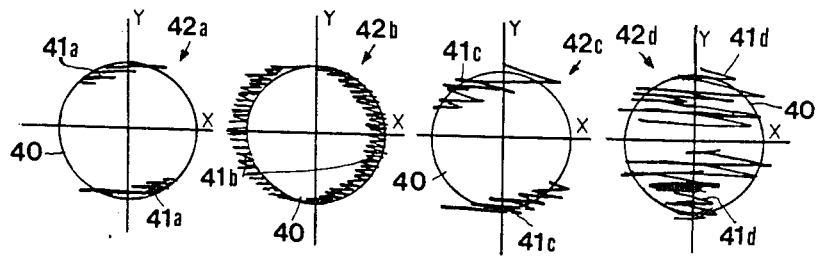
FIG. 6 is a similar oscillogram in the case of a corona discharge arising at the insulator of the overhead transmission line.
FIG. 7 is an oscillogram in the case where the fault location is a corroded part of the overhead transmission line.
FIG. 8 is an oscillogram for the case where the fault location is a mechanically damaged part of the overhead transmission line.
FIG. 9 is an oscillogram in the case where there is a short-circuit on the overhead transmission line.

In the oscillogram 42a of FIG. 6 disturbances 41a are present in the positive and negative peak regions of the closed curve 40 the amplitudes of which increase towards the peak of the curve. Such an oscillogram shows corona discharges at an insulator of the overhead transmission line.

The oscillogram 42b of FIG. 7 shows disturbances 41b uniformly distributed over the closed curve 40, which all have approximately the same amplitude. Such disturbances 41b are typical of a corroded part of the overhead transmission line.

As shown in FIG. 8, in the case of mechanically damaged overhead transmission line parts, such as insulators, clamps etcetera, the closed curve of the oscillogram 42c exhibits disturbances 41c with sharp saw-teeth superimposed in the positive and negative regions the amplitude and number of which increases with increasing damage, and in the case of a short-circuit developing from such damage the saw-tooth shaped disturbances 41d fill the whole of the area enveloped by the closed curve 40, as is shown in oscillogram 42d in FIG. 9 which thus shows a short circuit in the overhead transmission line.

When a significant phase difference is present in the overhead transmission line under test between the current and the voltage, a distortion may arise in the closed curve 40 originating from the low frequency signal components. Such distortions can be obviated by a phase shifter device 43 which according to FIG. 2 is connected to the signal input 21 of the amplifier device 20 and has e.g. at least one capacitor 44. In given cases the phase shifter 43 may be switchable on and off and/or may contain a variable electric component or several electric components, such as capacitors, which can be inverted or reversed. Expediently the phase shifter 43 has at least one capacitor between earth (ground) and the input 21 of the amplifying device.

As is also shown in FIG. 1, the signal output 22 of the amplifying device 20 is also connected with an optoelectronic indicating device 45 which may for instance contain a row of light-emitting diodes or a corresponding liquid crystal indicator and which permits the actual amplitude of the output signal of the amplifying device 20, especially the high frequency disturbance signals, to be visually detected.

Furthermore, according to FIG. 1 the signal output 22 of the amplifying device 20 is also connected to an electronic circuit 46 for producing an audio frequency signal which is fed to an output terminal 47. A headphone 48 or an on-board telephone system of the aircraft may be connected to the output terminal 47. The circuit arrangement 46 is constructed so that it produces an audible acoustic frequency or audio signal when high frequency disturbance signals arise. Further, the circuit arrangement 46 may comprise an audio frequency oscillator which generates an audio signal. the frequency of which is a function of the amplitude of the envelope of the high frequency disturbance signal $S_H$. Finally the circuit 46 may advantageously also contain a threshold detector so that the audio signal is generated only when the amplitudes of the disturbance signals exceed a certain threshold value. Adjusting means, e.g. in the form of a potentiometer 40 may be provided to enable the threshold value to be manually adjusted.

With the aid of the described control apparatus according to the invention practically all fault locations that can arise with overhead transmission lines may be detected and evaluated, and moreover not only faults at or in conductor lines and insulators, particularly also breakdown-proof insulators, but also in devices connected to them such as transformers, capacitors etc. In addition to high voltage lines, the control apparatus according to the invention may also be used to monitor other transmission lines, particularly power current lines for electric railways. By means of modifications in a circuit arrangement and/or constructive details which are purely routine for a person skilled in the art the control apparatus may be optimally matched to the particular purpose in hand. In many cases, fault locations along overhead transmission lines can be detected with this control apparatus even where the upper limiting frequency of the amplifying device is as low as 20 kHz, at least.

Figure 10:
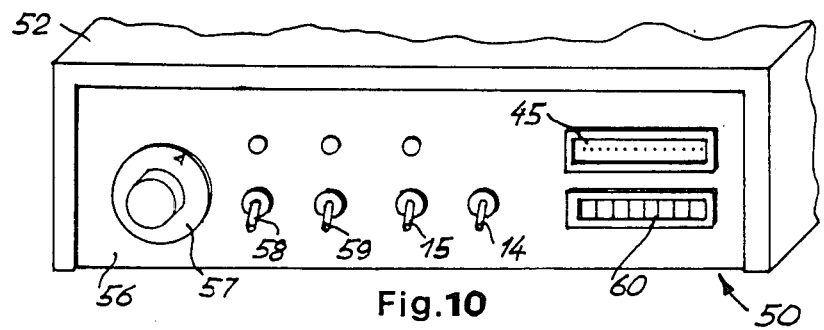
FIG. 10 is a perspective front view of an instrument consisting as essential parts the control apparatus shown in FIG. 1 and which is particularly suited for the monitoring of overhead transmission lines from a helicopter.
Figure 11:
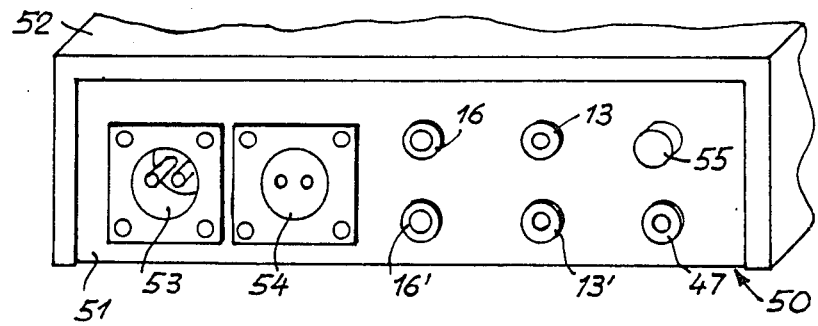
FIG. 11 is an analogous rear view of the same instrument.

In order to use the control apparatus in aircraft it is expedient to assemble important parts of the apparatus, except the oscilloscope 30, into a compact device 50, as is shown for example in FIGS. 10 and 11 and is also shown in broken lines in FIG. 1. According to FIG. 11 the back wall or panel 51 of a casing 52 has an instrument plug 53 for connection to the onboard mains of the aircraft or another source of direct current at a voltage of e.g. 24 V. Also on the back panel 51 there is a socket 54 for taking the supply current for the oscilloscope 30. Further, the already mentioned two terminals 16 and 16' for the signal cable to the oscilloscope 30 as well as the two antenna junctions 13 and 13' are also on the back panel 51. Finally the back panel 51 contains the output terminal 47 for the audio signal and an actuating knob 55 for the switching on and off of the audio frequency circuit arrangement 46 and for adjusting the potentiometer 49 to the desired threshold value for the audio signal.

According to FIG. 10 the front panel 56 of the casing 52 has the following components: a rotatable knob 57 for adjusting the variable resistor 27 (FIG. 2) for the regulation of the amplification, a main switch 58 for the switching on and off of electrical power via the instrument plug 33, a switch 59 for the switching on and off of electrical power supply to the socket 54 for the connection to the oscilloscope 30, the change-over switches 14 and 15 (FIG. 1), the opto-electronic indication device 45 (FIG. 1) and an elapsed time indicator 60 which always runs as long as the main switch 58 is switched on. The change-over switch 15 may expediently be coupled mechanically with an additional, non-illustrated switch for the switching on and off of power supply to the amplifying device 20 so that the amplifying device is always only switched on when the output terminal 16 is connected with the signal output 22 of the amplifying device 20 by way of the change-over switch 15.

In the interior of the casing 52 the amplifying device 20, the phase shifter 43, the audio frequency circuit arrangement 46 (FIG. 1) and a non-illustrated circuit arrangement for forming, filtering and optionally stabilising the electrical voltages required for the supply of the operational amplifiers 23 and 24 (FIG. 2), the opto-electronic indicator device 45 and the audio frequency circuit arrangement 46 (FIG. 1) are all accommodated, the input of this supply circuit arrangement being connected via the main switch 58 to the plug 53.

Figure 12:
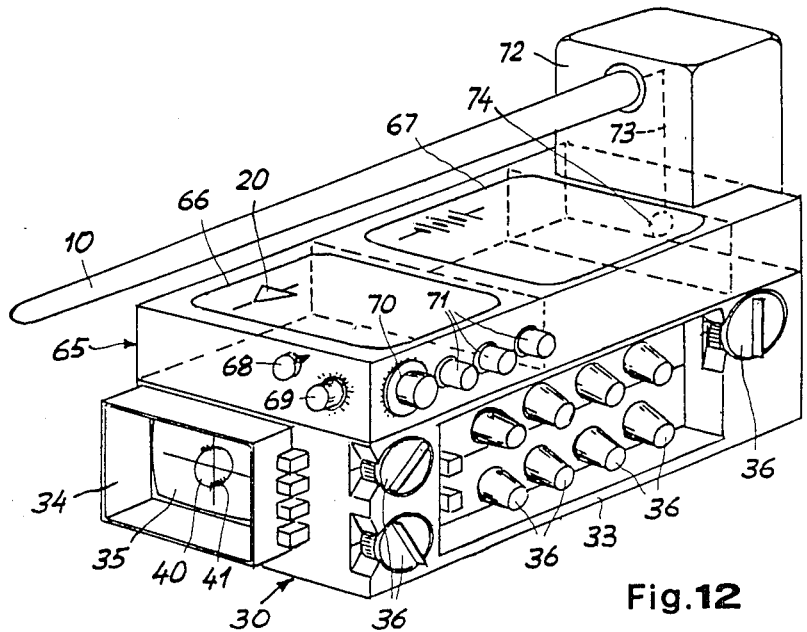
FIG. 12 is a perspective representation of a compact portable control apparatus which is particularly suited for the monitoring of overhead transmission lines from the ground.

For monitoring overhead transmission lines from the ground it is advantageous to construct the whole control apparatus according to the invention as a compact portable instrument which can be carried by a controller by means of a shoulder strap and which is easy to use. A preferred example of such an instrument is shown in FIG. 12 and will now be described. As the basic mechanical component of the instrument there is provided a battery operated oscilloscope 30 obtainable commercially, such as e.g. a "Tektronix dual-trace-oscilloscope 214". This oscilloscope has a prismatic flat housing 33 with an oscilloscope image screen 35 surrounded by a light hood 34 on the narrower side of the housing and a flat additional housing 65 is secured to the top of the housing 33 of the oscilloscope 30 and this additional housing has a compartment 66 for accommodating the amplifying device 20 (FIG. 1) and a further compartment 67 in which batteries and in given cases associated circuit arrangements for the electrical supply of the amplifier device 20 and, in so far as necessary, a supply of the oscilloscope 30 are accommodated. Rotary knobs 68, 69 and 70 are arranged on the outside of the additional housing 65 for the use and regulation of the amplifying device 20 and the phase shifter device 43 (FIG. 1) as well as press button 71 for actuating switches for a switching on and off as well as changing over of circuits. In this portable embodiment of the control apparatus only a single antenna 10 is required. This is preferably a commercially available anti-vibration antenna which is secured at an intermediate housing 72 which in its turn is releasably mounted by means of plug-in connections on the rear narrow side of the additional housing 65. By means of one of the mentioned plug-in connectors the electrical connection is established between as antenna cable 73 and an antenna terminal 74 connected with the signal input 21 (FIG. 1) of the amplifying device 20. As may be seen in FIG. 12, the antenna 10 is so arranged that it extends in a somewhat spaced relationship along the additional housing 65 and does not disturb either the use of the control apparatus or the inspection of the oscilloscope image screen 35. In a manner not illustrated in further detail, the intermediate housing 72 is so formed that it also produces by means of plug-in connectors the necessary electricl connections between the signal output of the amplifier apparatus 20 and the signal inputs of the oscilloscope 30 for the X and Y deflection of the image spot.

Figure 13:
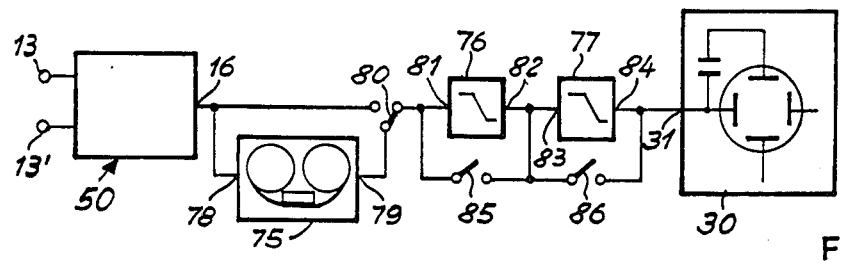
FIG. 13 is a schematic block circuit diagram of a further embodiment of the control apparatus according to the invention.

In FIG. 13, the block circuit diagram of a modified embodiment of the control apparatus described with reference to FIG. 1 is illustrated, where the same reference numerals are used as fas as similar components are concerned. Again in FIG. 13 the compact device 50 having two terminals 13 and 13' for connecting the antenna 10 or 10', respectively, and the signal output terminal 16, as well as the oscilloscope 30 having the signal input terminal 31 can be seen. Contrary to the embodiment shown in FIG. 1, there is no direct connection between the signal output terminal 16 and the signal input terminal 31, but a magnetic tape recording and reproducing device 75 and two low-pass filters 76 and 77 are connected in series there between. The magnetic tape device 75 comprises a signal input terminal 78 connected with the output terminal 16 of the device 50, for receiving the electric signals to be recorded on a magnetic tape, as well as an output terminal 79 for the signals played back from the magnetic tape. By means of a switch 80, which can be operated at will, it is possible to connect the signal input 81 of the first low-pass filter 76 respectively with the output terminal 79 or the input terminal 78 of the magnetic tape device 75. The signal output 82 of the first low-pass filter 76 is connected with the signal input 83 of the second low-pass filter 77, the output of which is connected with the signal input terminal 31 of the oscilloscope 30. Two switches 85 and 86, individually operable at will, allow to by-pass selectively one or the other, or both of the low-pass filters 76 and 77, for making them inoperative. By means of the first low-pass filter 76, signals having frequencies above 20 kHz, for example, are reduced or suppressed, whereas by means of the second low-pass filter 77 signals having frequencies above 15 kHz, for example, are reduced or suppressed.

The mode of operation of the control apparatus according to FIG. 13 is similar to that of the control apparatus shown in FIG. 1, except as follows: The operator can record the output signals of the compact device 50 on a magnetic tape by means of the magnetic tape device 75, as far as this is allowed by the frequency response of the device 75 in the recording and play back phases. Depending on the position of the switch 80, selectively the receiving signals delivered by the compact device 50 or the signals recorded on a magnetic tape can be made visible on the image screen of the oscilloscope 30. This allows repetitions and time-delayed observations and analyses of possibly detected disturbances on the image screen of the oscilloscope. When the switch 85 or 86 is opended the respective low-pass filter 76 or 77 is put in action in order to suppress high-frequency signals which otherwise would trouble the visual observation, if required, said high-frequency signals being caused, for example, by a broadcasting or television emitter or by atmospheric disturbances or simply by thermal background noise.

We claim:

1. Apparatus for the electronic detection of faults arising in alternating current overhead transmission lines where power losses arise through corona discharges, comprising at least one antenna for the reception of signals radiated by said transmission lines, an amplifying device connected to said antenna for amplifying the received signals and an oscilloscope for the visual indication of the received signals, wherein the amplifying device (20) is dimensioned to have a broad-band gain characteristic covering a frequency spectrum from below the transmission line power frequency to an upper frequency of at least 20 KHZ, with the gain at the power frequency being considerably below the gain at the upper frequency; wherein the entire frequency spectrum of the amplifying device output signals ($S_N$ and $S_H$) is applied to the oscilloscope to produce a smooth closed curve (40) defined by said power frequency components signal ($S_N$), and wherein said amplifying device upper frequency signal components ($S_H$) define a disturbance (41) of said smooth closed curve and represents said corona discharges by its appearance, magnitude and position, enabling the location and type of fault on the transmission line to be determined.

2. Apparatus according to claim 1, characterised in that the upper limiting frequency of the amplifying device (20) is between 200 MHz and 1 GHz, and in that the gain is at least 40 dB in a range of 20 to 200 MHz.

3. Apparatus according to claim 1, characterised in that at least one low-pass filter (76; 77) is selectively switchable into the circuit between the amplifying device (20) and the oscilloscope (30).

4. Apparatus according to claim 1, characterised in that a phase-shifting device (43) with at least one capacitor (44) is connected at the signal input (21) of the amplifying device (20), for the compensation of phase displacements arising in the received low frequency signal ($S_N$), which phase displacement distort the smooth closed curve (40) indicated on the oscilloscope image screen (35).

5. Apparatus according to claim 4, characterised in that the phase shifting device (43) containing a capacitor (44) is adjustable by means of a manually actuatable service knob (70).

6. Apparatus according to claim 1, characterised in that it comprises two antenna terminals (13, 13') and a change-over switch (14) for the selectable connection of one or other antenna terminal with the input of the amplifying device (20); and that for monitoring of transmission lines from the air by means of an aircraft, or helicopter, two antennas (10, 10') are present which are arranged for being secured to the left and right sides of the aircraft and each of which is connectible by means of a shielded cable (12, 12') with one of the antenna terminals (13, 13').

7. Apparatus according to claim 1, characterised in that an opto-electronic signal level indicating device (45) is connected to the output (22) of the amplifying device (20).

8. Apparatus according to claim 1, characterised in that the output (22) of the amplifying device (20) is connected with an audio frequency circuit arrangement (46) having a terminal (47) for connecting an electro-acoustic signal emitting device (48).

9. Apparatus according to claim 8, characterised in that the audio frequency circuit arrangement (46) comprises means for suppressing signals with amplitudes smaller than a predetermined and preferably adjustable threshold value.

10. Apparatus according to claim 8, characterised in that the audio frequency circuit arrangement (46) comprises means for producing an audio frequency signal, the frequency of which is dependent on the amplitude of the high frequency signal ($S_H$).

11. Apparatus according to claim 1, characterised in that at least the amplifying device (20) and a current supply unit are combined together into a compact instrument (50) which comprises at least one terminal (13) connected with an input (21) of the amplifying device (20), for connection of the antenna (10), and also an elapsed time counter (60).

* * * * *